(12) United States Patent
Trautmann et al.

(10) Patent No.: US 8,085,951 B2
(45) Date of Patent: Dec. 27, 2011

(54) METHOD AND SYSTEM FOR DETERMINING A GAIN REDUCTION PARAMETER LEVEL FOR LOUDSPEAKER EQUALIZATION

(75) Inventors: Steven David Trautmann, Tsukuba (JP); Akihiro Yonemoto, Tokyo (JP); Atsuhiro Sakurai, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 488 days.

(21) Appl. No.: 12/409,347

(22) Filed: Mar. 23, 2009

(65) Prior Publication Data

US 2010/0239097 A1 Sep. 23, 2010

(51) Int. Cl.
*H03G 5/00* (2006.01)
*H04M 3/00* (2006.01)
(52) U.S. Cl. .......... 381/101; 381/59; 381/103; 333/28 R
(58) Field of Classification Search .................... 381/59, 381/61, 96, 97, 98, 101, 102, 103; 333/28 R
See application file for complete search history.

(56) References Cited

U.S. PATENT DOCUMENTS

| | | | |
|---|---|---|---|
| 4,342,059 A | * | 7/1982 | Wray ....................... 360/123.01 |
| 6,721,428 B1 | | 4/2004 | Allred et al. |
| 2003/0112088 A1 | * | 6/2003 | Bizjak ............................. 333/14 |
| 2006/0088173 A1 | * | 4/2006 | Rodman et al. ................ 381/92 |
| 2007/0025557 A1 | | 2/2007 | Nackvi et al. |
| 2008/0123873 A1 | * | 5/2008 | Bjorn-Josefsen et al. .... 381/106 |

OTHER PUBLICATIONS

Wee Ser et al., "Loudspeaker Equalization with Post-Processing," EURASIP Journal on Applied Signal Processing 2002:11, 1296-1300, revised Jun. 23, 2002, Hindawi Publishing Corporation.

* cited by examiner

*Primary Examiner* — Phuc Dang
(74) *Attorney, Agent, or Firm* — Mima Abyad; Wade J. Brady, III; Frederick J. Telecky, Jr.

(57) ABSTRACT

Methods, digital systems, and computer readable media are provided for determining a gain reduction parameter level for loudspeaker equalization by determining a noise score, an equalization effectiveness score, and an equalization non-effectiveness score for a candidate gain reduction parameter level, determining a composite quality score using the three scores, and designing a compensating filter for the loudspeaker using the candidate gain reduction parameter level if the composite quality score is better than composite quality scores of all other candidate gain reduction parameter levels.

20 Claims, 10 Drawing Sheets

METHOD AND SYSTEM FOR DETERMINING A GAIN REDUCTION PARAMETER LEVEL FOR LOUDSPEAKER EQUALIZATION

BACKGROUND

In general, a loudspeaker is a device that converts an audio signal from its electric form to an audible sound wave. Noticeable distortions may be introduced into the audio signal during this conversion that result in a significant loss of sound quality. To improve the sound quality of the audio signal reproduced by a loudspeaker, loudspeaker equalization may be performed in which inherent variations with frequency in the amplitude, or sound level, of the sound reproduced by the loudspeaker for a given level of signal driving the loudspeaker are normalized. More specifically, loudspeaker equalization may be accomplished by filters applied to an audio signal which are designed to compensate for the loudspeaker response. Generally, to design a compensating filter, a known test signal is applied to the loudspeaker in an environment (e.g., a room, the interior of an automobile, etc.), and the output of the loudspeaker is picked up by a microphone. The whole system (pre-loudspeaker, loudspeaker, environment, and microphone) is then analyzed, for example, by comparing the spectrum of the test signal to the spectrum of the output of the loudspeaker. If the response of the microphone is known, then the joint effect of the loudspeaker and the environment can be isolated in principle and this information used to design the compensating filter.

In some instances, the compensating filter is designed to improve the quality of the listener experience by equalizing (flattening) the spectral response of an audio system (including loudspeaker). In addition, the compensating filter may be designed to result in an approximation of a desired system response target such as the spectral response of higher quality loudspeakers. The equalization is typically accomplished by reducing the volume in certain spectral regions to avoid clipping. However reducing the volume in certain spectral regions generally reduces the overall perceived volume. Reducing overall perceived volume allows more spectral contrast with the original loudspeaker spectrum. However, reducing the overall perceived volume decreases the signal-to-noise ratio. Therefore, in designing a compensating filter, a trade-off should be made between minimizing the volume reduction and maximizing the overall effect.

SUMMARY

Embodiments of the invention provide for determining a gain reduction parameter level for loudspeaker equalization. In general, in one aspect, the invention relates to a method for determining a gain reduction parameter level for equalization of a loudspeaker where the method includes determining a noise score for a candidate gain reduction parameter level in a plurality of candidate gain reduction parameter levels, wherein the noise score is based on the relative reduction in a signal-to-noise ratio caused by the candidate gain reduction parameter level, determining an equalization effectiveness score for the candidate gain reduction parameter level, wherein the equalization effectiveness score is based on a number of octaves in a measured frequency response where an equalization effect is achieved using the candidate gain reduction parameter level, determining an equalization non-effectiveness score for the candidate gain reduction parameter level, wherein the equalization non-effectiveness score is based on an area between a target frequency response and the measured frequency response where the target frequency response is not reached using the candidate gain reduction parameter level, determining a composite quality score for the candidate gain level reduction using the noise score, the equalization effectiveness score, and the equalization non-effectiveness score, and designing a compensating filter for the loudspeaker using the candidate gain reduction parameter level if the composite quality score is better than composite quality scores of all other candidate gain reduction parameter levels in the plurality of candidate gain reduction parameter levels.

In general, in one aspect, the invention relates to a digital system that includes a processor, a loudspeaker, and a memory storing software instructions, wherein when executed by the processor, the software instructions cause the digital system to perform the above described method for equalization of the loudspeaker.

In general, in one aspect, the invention relates to a computer readable medium that includes executable instructions to perform the above described method when executed by a processor.

BRIEF DESCRIPTION OF THE DRAWINGS

Particular embodiments in accordance with the invention will now be described, by way of example only, and with reference to the accompanying drawings.

DETAILED DESCRIPTION

Figure 1:
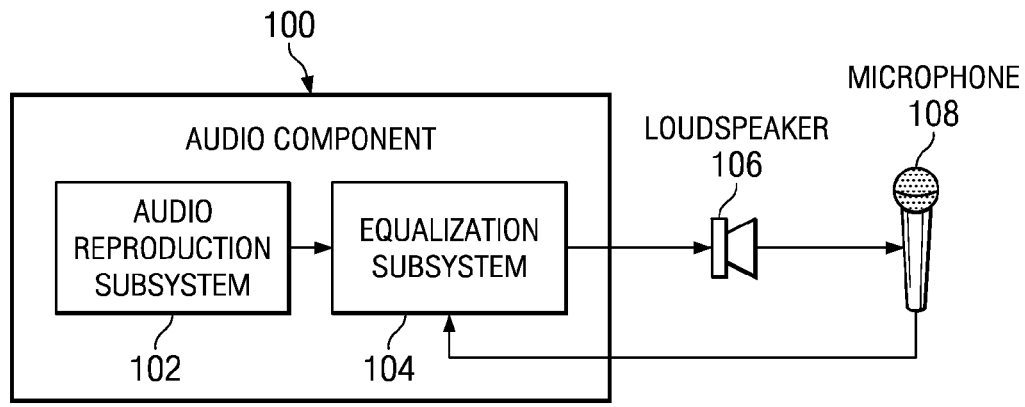
FIG. 1 shows a sound reproduction system in accordance with one or more embodiments of the invention.

Specific embodiments of the invention will now be described in detail with reference to the accompanying figures. Like elements in the various figures are denoted by like reference numerals for consistency.

Certain terms are used throughout the following description and the claims to refer to particular system components. As one skilled in the art will appreciate, components in systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description. In addition, although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

In general, embodiments of the invention provide for determining a gain reduction parameter for use in the design of a compensating filter for loudspeaker equalization. The gain reduction parameter represents the gain reduction of the final target frequency spectrum relative to the measured frequency spectrum, beginning at a point where the final target frequency spectrum has greater or equal magnitude than the measured frequency spectrum at every frequency but has equal magnitude at at least one frequency, which is considered 0 dB gain reduction. The gain reduction parameter can also be thought of as the maximum gain reduction at any frequency due to an ideal compensating filter.

More specifically, as part of analyzing a measured frequency spectrum vis-à-vis a target frequency spectrum, a gain reduction parameter level that maximizes spectral contrast while minimizing gain reduction in a compensating filter is selected based on composite quality scores calculated for a sequence of candidate parameter levels between and including no gain reduction level (0 dB) and a maximum allowable gain reduction level. The candidate gain reduction parameter level in the sequence with the best composite quality score is chosen as the gain reduction parameter to be used in designing the compensating filter. In general, designing a compensating filter includes applying a fixed algorithm using the analysis results including the selected gain reduction parameter level as input to determine the filter coefficients to be used for the actual filtering. Any suitable filter design algorithm may be used to design the compensating filter.

FIG. 1 is a block diagram of an audio system in accordance with one or more embodiments of the invention that is configured to design a compensating filter for loudspeaker equalization using the method for determining a gain reduction parameter level described below and to use the resulting compensating filter. The audio system includes an audio component (100), a loudspeaker (106), and a microphone (108). The audio component (100) includes an audio reproduction subsystem (102) and an equalization subsystem (104). The audio reproduction subsystem (102) includes functionality to produce an audio signal and provide that signal to the equalization subsystem (104). The audio reproduction subsystem (102) may be, for example, a radio receiver, a compact disk player, a television receiver, a tape player, a DVD player, etc.

The equalization subsystem (104) includes functionality to design a compensating filter for the loudspeaker (106) and to apply that compensating filter to the audio signal received from the audio reproduction subsystem (102) before providing the audio signal to the loudspeaker (106). The functionality for designing a compensating filter is explained in more detail below in reference to FIG. 2 and the functionality for applying the compensating filter is explained in more detail below in reference to FIG. 3. In one or more embodiments of the invention, the equalization subsystem (104) includes a digital system (not shown) for performing the computations required to design and apply the compensating filter. Embodiments of the invention may include any of several types of digital systems: digital signal processors (DSPs), general purpose programmable processors, application specific circuits, or systems on a chip (SoC) such as combinations of a DSP and a RISC processor together with various specialized programmable accelerators. Software instructions stored in a computer readable medium such as onboard or external memory (e.g., RAM, ROM, Flash) or a storage device (e.g., compact disk, DVD, USB key) may be used to implement both the design and the application of the compensating filter.

Figure 2:
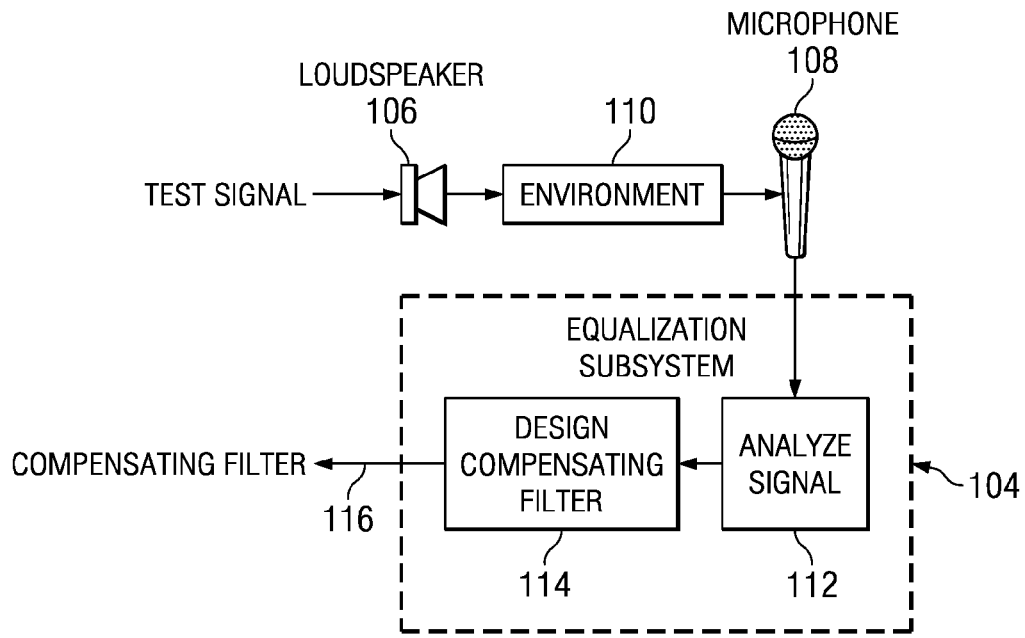
FIG. 2 shows a block diagram of compensating filter design in accordance with one or more embodiments of the invention.

FIG. 2 is a block diagram illustrating the design of a compensating filter by the equalization subsystem (104) in accordance with one or more embodiments of the invention. To design the compensating filter, the equalization subsystem (104) applies a known test audio signal to the loudspeaker (106). The test audio signal may be provided, for example, as a part of a loudspeaker equalization application installed on the audio system, from an external storage device, etc. In some embodiments of the invention, the test audio signal is generated by playback of an audio file containing the test audio signal. Further, in some embodiments of the invention, the test audio signal is generated algorithmically. The loudspeaker (106) broadcasts the test audio signal into the environment (110) and the microphone (108) picks up the reproduced test audio signal. The environment (110) may be, for example, a room or the interior of an automobile. The microphone (108) returns the reproduced test audio signal to the equalization subsystem (104) where the reproduced test audio signal is analyzed (112) and a compensating filter (116) is designed (114) based on the results of the analysis (112). The compensating filter (116) is designed by applying a filter design algorithm using the analysis results (in particular, a target spectrum for the compensating filter) as input to determine the filter coefficients to be used for the actual filtering. Any suitable filter design algorithm may be used.

In one or more embodiments of the invention, the analysis of the test audio signal includes comparing the reproduced test audio signal to the original test audio signal to find the effect of the system on the test frequency spectrum, i.e., the system frequency spectrum or measured frequency spectrum. The measured frequency spectrum is then compared to the frequency spectrum of a target audio signal. The target frequency spectrum may be, for example, a flat spectrum or a higher quality speaker spectrum. As a part of the analysis (112), the method for determining a gain reduction parameter level described below is performed. The gain reduction level determined by the method is used in the design of the compensating filter.

Figure 3:
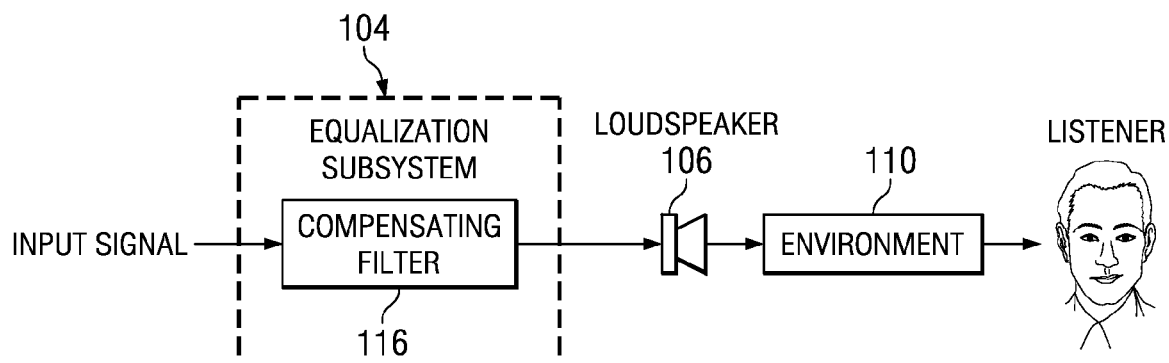
FIG. 3 shows a block diagram of compensating filter use in accordance with one or more embodiments of the invention.

FIG. 3 is a block diagram illustrating the use of the compensating filter (116) of FIG. 2 in accordance with one or more embodiments of the invention. Once the compensating filter (116) is designed, the equalization subsystem (104) applies the compensating filter (116) to input audio signals received from the audio reproduction subsystem (102). The equalization subsystem (104) then applies the resulting filtered audio signals to the loudspeaker (106) which broadcasts the filtered audio signals into the environment (110) to be heard by a listener. In one or more embodiments of the invention, the microphone (108) is removed from the audio system once the compensating filter (116) is designed.

Figure 4:
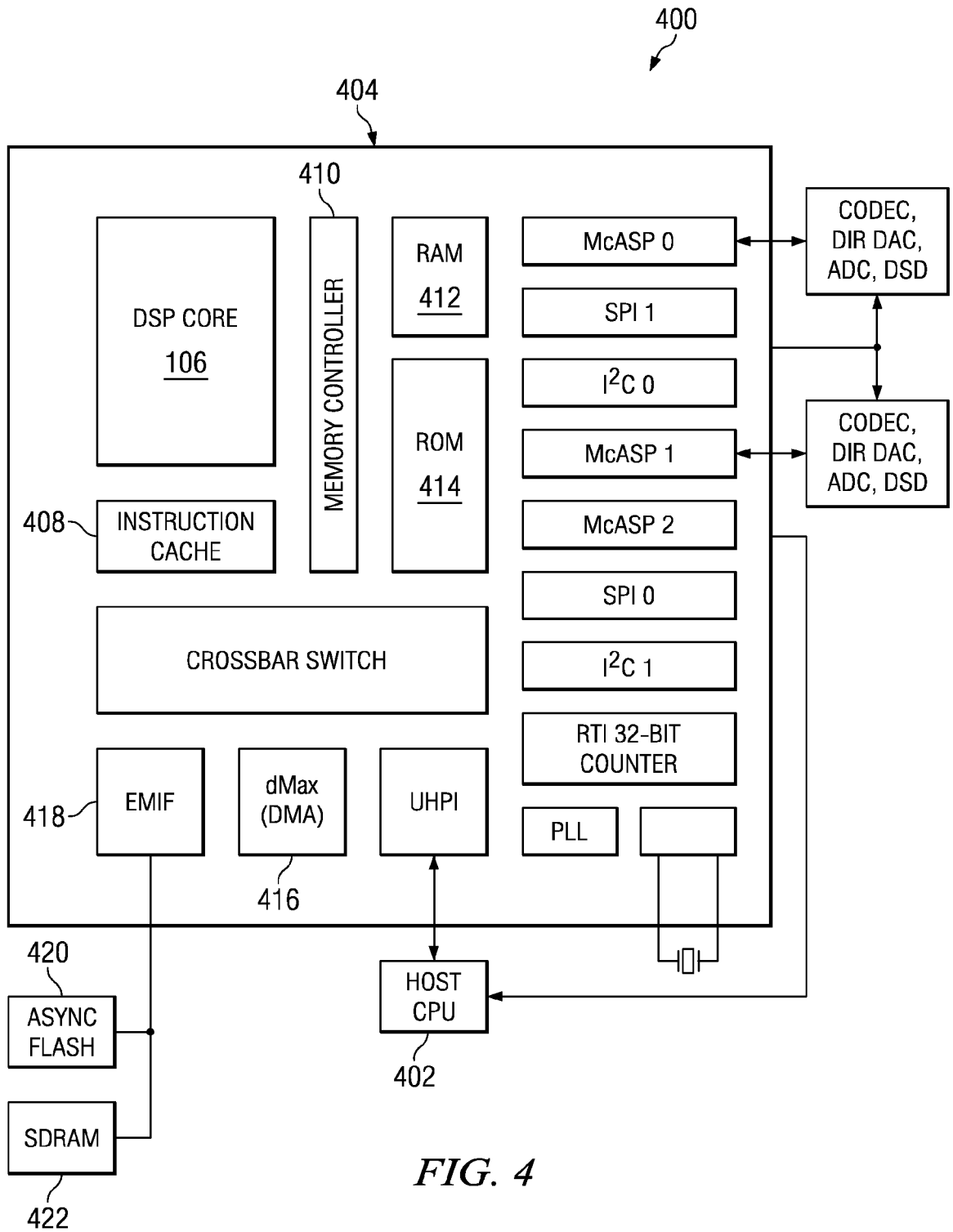
FIG. 4 shows a block diagram of an illustrative digital system in accordance with one or more embodiments of the invention.

FIG. 4 is a block diagram of a digital system (400) that may be used in the audio system of FIG. 1. The digital system (400) includes a host central processing unit (CPU) (102) connected to a digital signal processor (DSP) (104) by a high speed bus. The DSP (104) is configured for multi-channel audio decoding and post-processing as well as high-speed audio encoding. More specifically, the DSP (104) includes, among other components, a DSP core (106), an instruction cache (108), a DMA engine (dMAX) (116) optimized for audio, a memory controller (110) interfacing to an onchip RAM (112) and ROM (114), and an external memory interface (EMIF) (118) for accessing offchip memory such as Flash memory (120) and SDRAM (122). In one or more embodiments of the invention, the DSP core (106) is a 32-/64-bit floating point DSP core. In one or more embodiments of the invention, the methods described herein may be partially or completely implemented in computer instructions stored in any of the onchip or offchip memories. The DSP (104) also includes multiple multichannel audio serial ports (McASP) for interfacing to codecs, digital to audio converters (DAC), audio to digital converters (ADC), etc., multiple serial peripheral interface (SPI) ports, and multiple inter-integrated circuit ($I^2C$) ports. In one or more embodiments of the invention, the computations required to design a compensating filter using the method for determining gain reduction parameter level described below and to use the resulting compensating filter may be performed by the DSP (104).

Figure 5A:
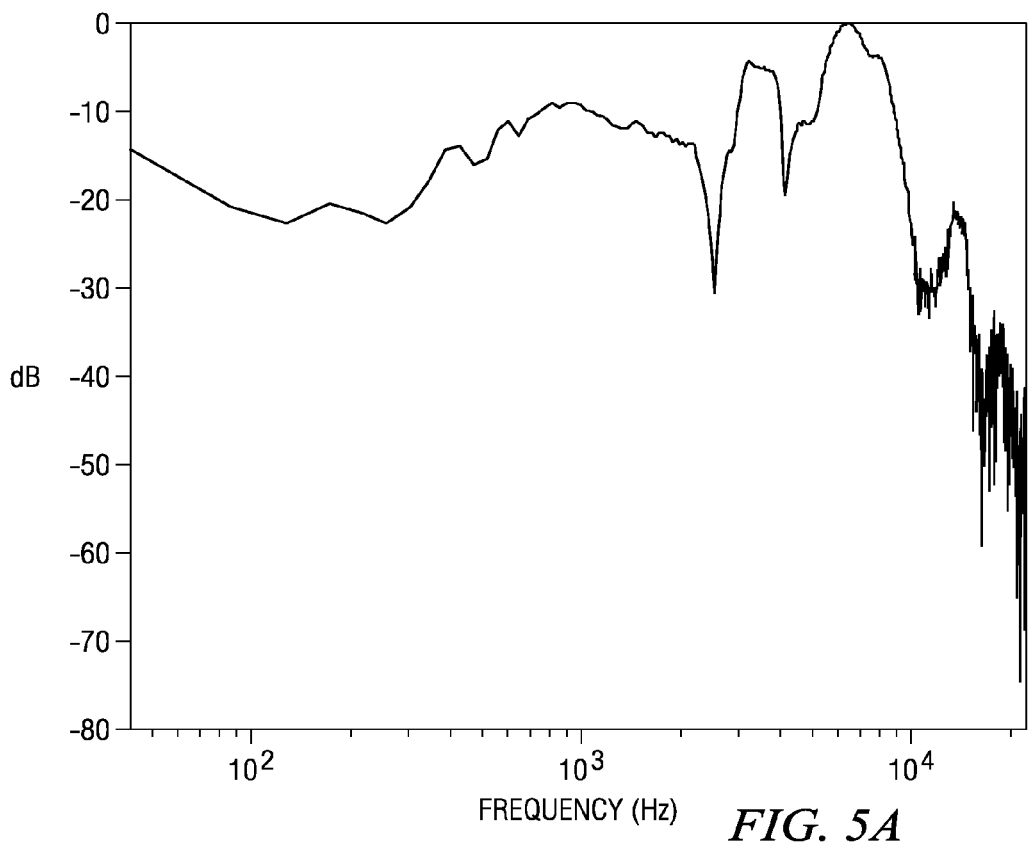
FIGS. 5A-5C show, respectively, graphs of an example measured frequency response and equalization achievable at two levels of gain reduction in accordance with one or more embodiments of the invention.
Figure 5B:
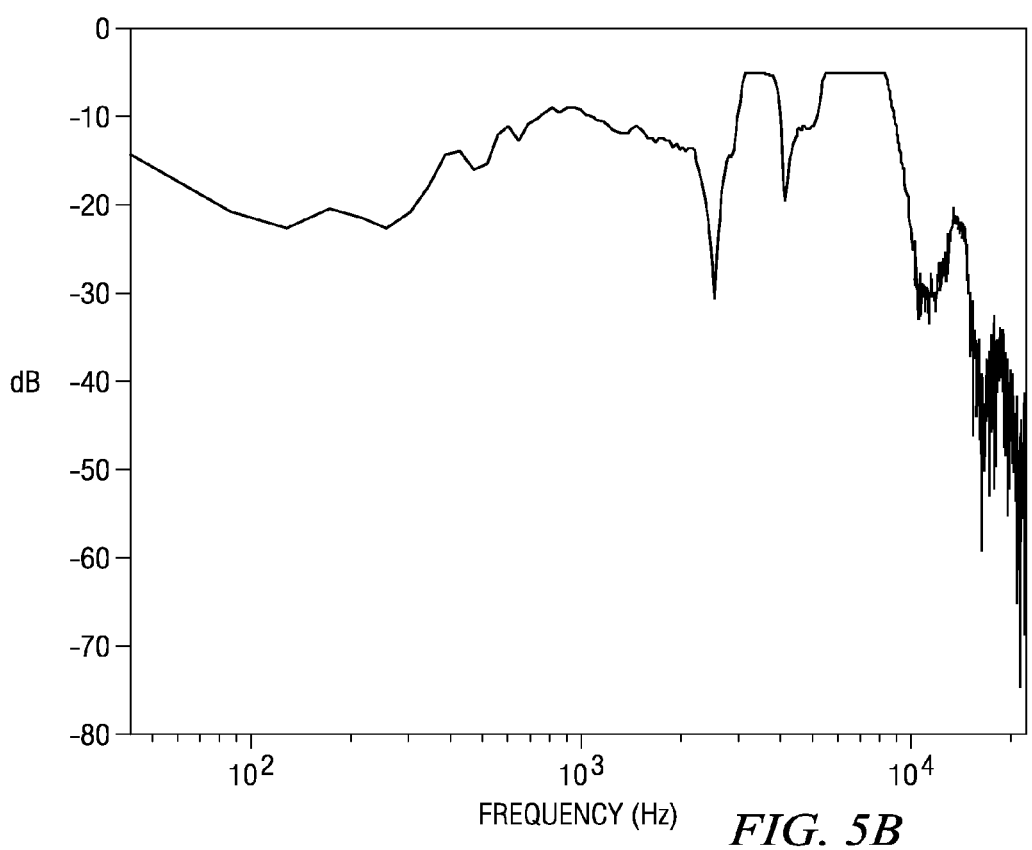
Figure 5C:
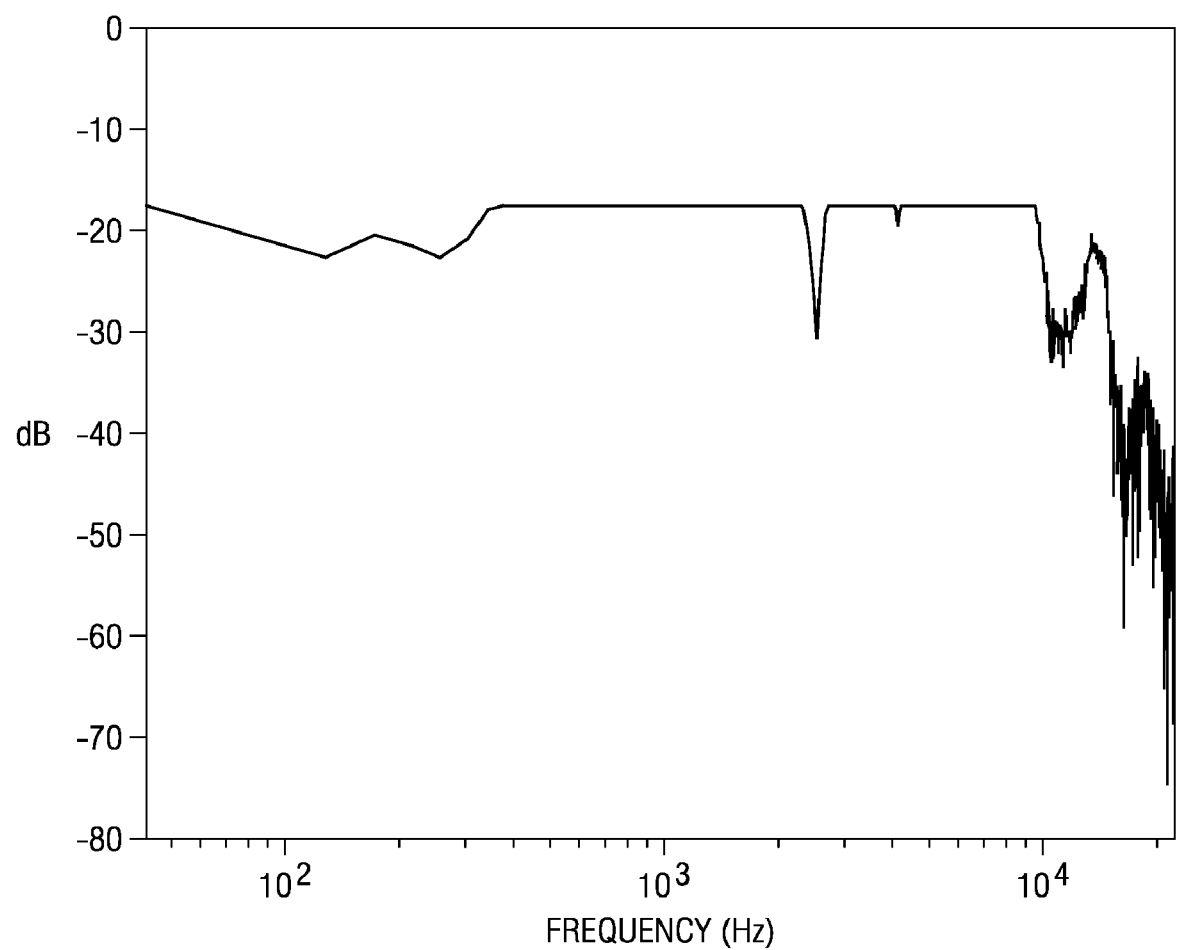

Boosting an audio signal digitally in the frequency domain is much more likely to cause eventual overflow than reducing the audio signal. Therefore, a digital loudspeaker equalization filter, i.e., a compensating filter, is typically designed to reduce or maintain the original output magnitude of an audio signal at every frequency. If the measured frequency response, i.e., the frequency response of the loudspeaker without the compensating filter, is very uneven, then reducing magnitude peaks in frequency response of the audio system slightly will make only slight improvements. Likewise if the measured frequency response is close to the frequency response of the target audio spectrum, only a slight reduction might be needed. FIG. 5A shows a measured frequency response, while FIGS. 5B and 5C show the amount of equalization achievable with a maximum 5.2 dB gain reduction parameter and 17.6 dB gain reduction parameter respectively.

Figure 6:
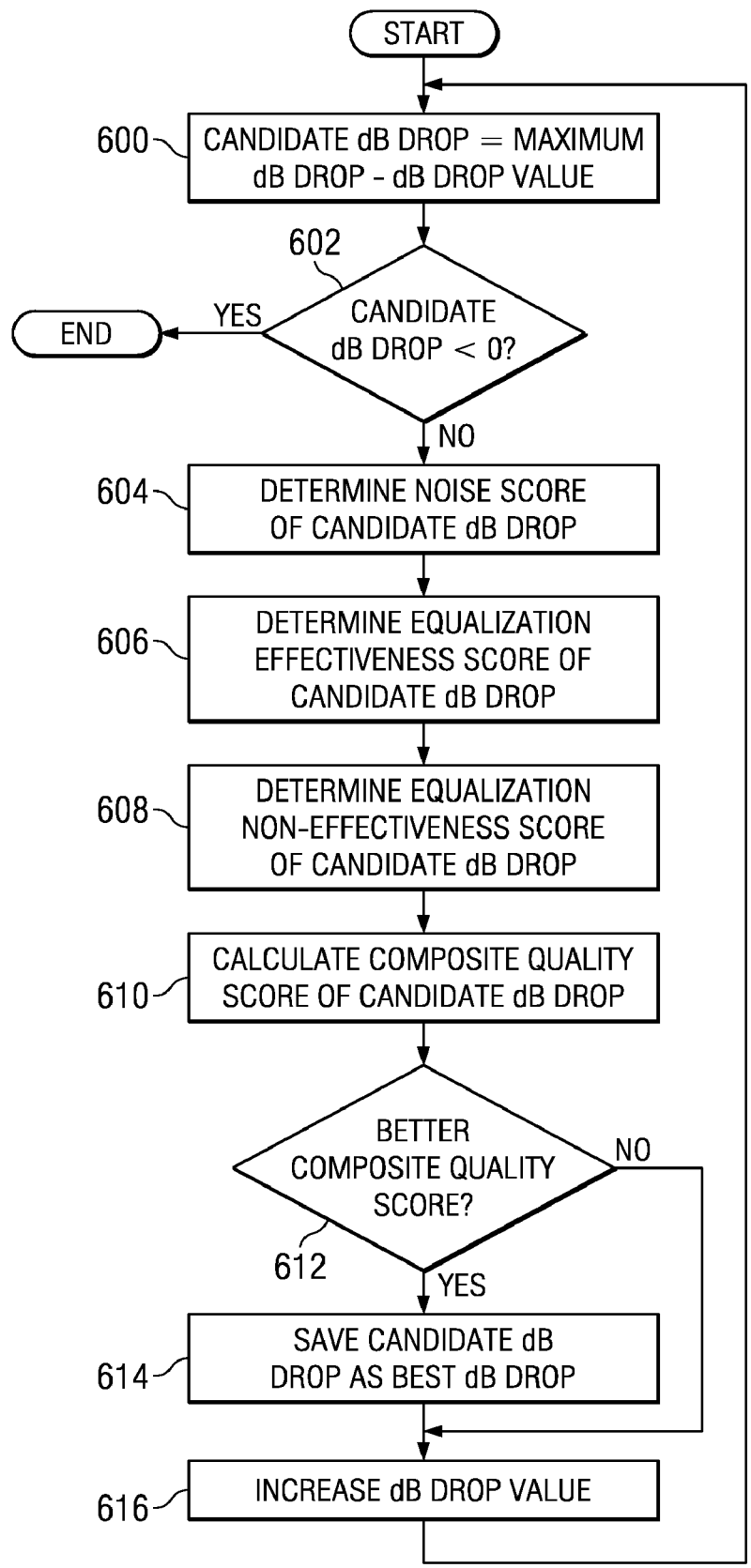
FIG. 6 shows a flow diagram of a method for determining a gain reduction parameter in accordance with one or more embodiments of the invention.

Unfortunately, as previously mentioned, reducing gain may decrease the signal-to-noise ratio, thus affecting the quality of the audio signal. Therefore, when designing a compensating filter, a trade-off should be made between minimizing gain reduction and maximizing the overall equalization effect. FIG. 6 is a flow diagram of a method for determining a gain reduction parameter level to be used in designing a compensating filter in accordance with one or more embodiments of the invention. The method measures the quality of the measured frequency response at various gain reduction parameter levels and chooses the best gain reduction parameter level, i.e., the gain reduction parameter level with the highest composite quality score. The quality scores used to determine the composite quality score at each gain reduction parameter level are a noise score based on the signal-to-noise ratio (SNR) reduction resulting from the gain reduction parameter level, an equalization effectiveness score based on the number of octaves where the target frequency response is reached using the gain reduction parameter level, and an equalization non-effectiveness score based on the area between the target frequency response and the measured frequency response where the target frequency response is not reached using the gain reduction parameter level.

As shown in FIG. 6, in one or more embodiments of the invention, the method begins with a maximum allowable gain reduction (i.e., a maximum decibel (dB) drop) and iterates through a sequence of decreasing candidate gain reduction values, calculating the quality scores for each gain reduction value, calculating a composite quality score for each gain reduction value based on the quality scores, and determining whether the composite quality score of each gain reduction value is better than that of any preceding gain reduction value. The method terminates when the candidate gain reduction value is less than zero and the gain reduction value with the highest composite quality score is used to design the compensating filter. In other embodiments of the invention, the method may begin with a candidate gain reduction value of zero and iterate through a sequence of increasing candidate gain reduction values until the candidate gain reduction value exceeds the maximum allowable gain reduction.

More specifically, the method of FIG. 6 begins by determining a candidate dB drop for the current iteration (600). The candidate dB drop for each iteration is a maximum allowable dB drop less a dB drop value. For the first iteration, the dB drop value is 0 dB. In each subsequent iteration, the dB drop value is increased (616) by a predetermined amount, thus decreasing the candidate dB drop for that iteration. In one or more embodiments of the invention, the predetermined amount of increase is 0.1 dB. In some embodiments of the invention, larger or smaller amounts of increase may be used. The value of the maximum allowable dB drop is set such that the signal-to-noise ratio does not fall below a certain level. In one or more embodiments of the invention, the maximum allowable dB drop is determined by the manufacturer of the audio system. In some embodiments of the invention, the end user of the audio system may specify the maximum allowable dB drop using a user interface. In one or more embodiments of the invention, the maximum allowable dB drop is 24.0 dB.

Figure 7:
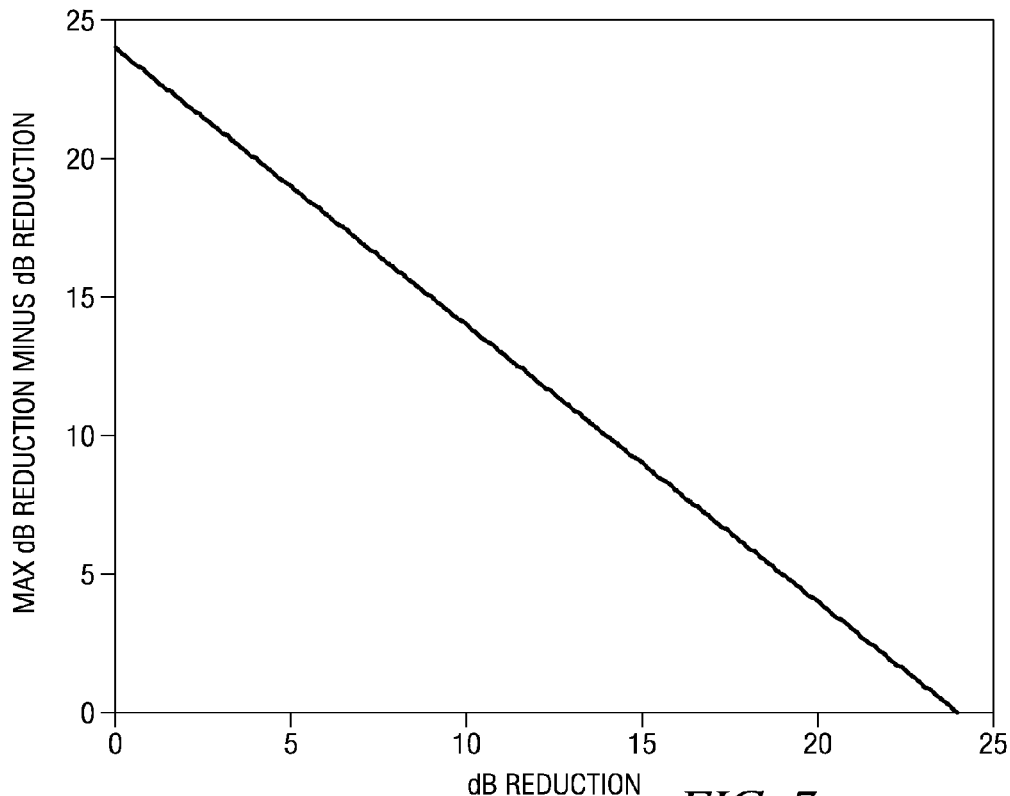
FIGS. 7, 8, 9A, 9B, 10, 11A, and 11B show graphs in accordance with one or more embodiments of the invention.

If the candidate dB drop is not less than 0 (602), a noise score is determined for the candidate dB drop (604). This noise score reflects the cost of the noise, i.e., the relative reduction in the signal to noise ratio, caused by the candidate dB drop. Note that if the amount of noise is constant (as it is for quantization noise), every 6 dB gain reduction effectively reduces the signal-to-noise ratio by 6 dB as well. Thus, reduction in signal-to-noise ratio (SNR) (which increases noise) is a linear function of gain reduction in dB. Then, in one or more embodiments of the invention, a function for determining the noise score (that does not depend on the measured or target frequency spectrum) can be made to mimic the linearly decreasing desirability of each dB reduction out to the limit as shown in FIG. 7. More specifically, in some embodiments of the invention, the noise score is the maximum allowable dB level minus the candidate dB level and may be normalized by the maximum allowable dB level. In other embodiments of the invention, a less simple function may be used to represent the noise score. Rather than treating the reduction in SNR as a linear function of gain reduction in dB, more complicated functions may be used to represent different trade-off strategies between SNR and gain reduction level such as a concave or convex curve, a piecewise linear function with different slopes over different dB regions, etc.

An equalization effectiveness score is also determined for the candidate drop (606). In one or more embodiments of the invention, the equalization effectiveness score is the number of octaves in the measured frequency response where the equalization effect is achieved when the candidate dB drop is used and may be normalized by the number of octaves considered when determining the number of octaves where the equalization effect is achieved, i.e., where the target frequency spectrum shape (flat or otherwise) is obtained. In one or more embodiments of the invention, the total number of octaves considered is the logarithm base 2 of the highest measured frequency divided by the lowest measured frequency within the range of hearing. The range of hearing is generally considered to be 20 Hz to 20 kHz. In some embodiments of the invention, different frequency ranges in the measured frequency response may also be weighted by relative importance before determining the total number of octaves where the equalization effect is achieved. The weighting may be based, for example, by hearing sensitivity, by placing emphasis on lower frequencies over higher ones, etc.

Figure 8:
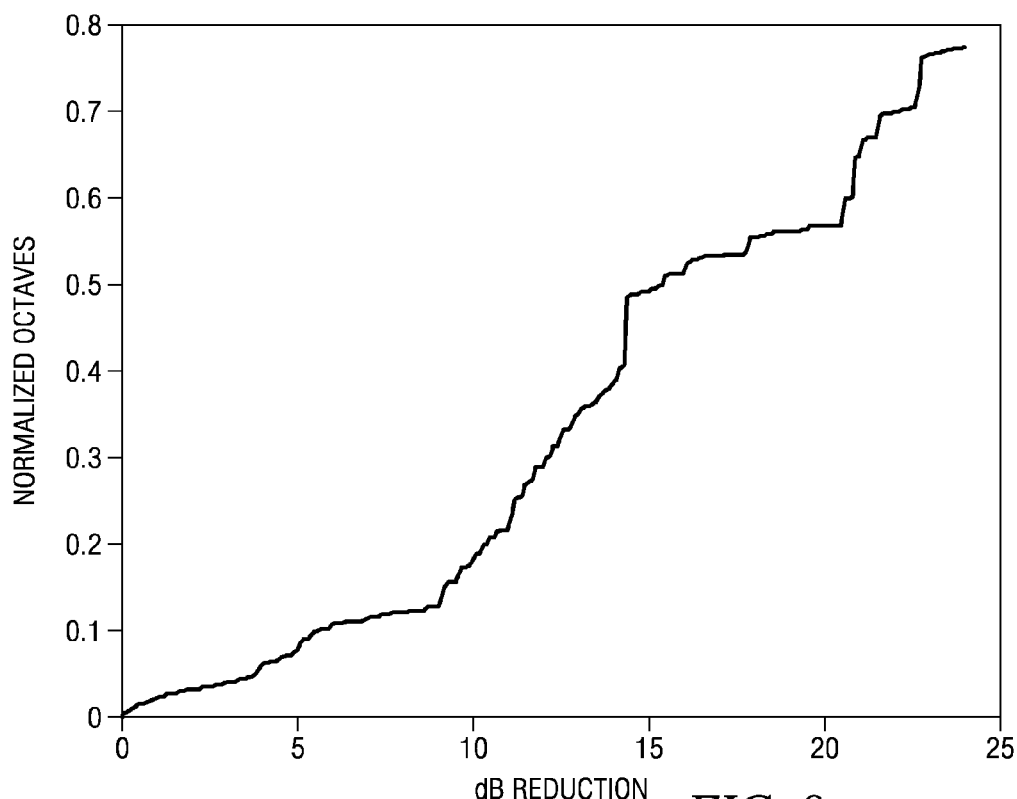

FIG. 8 shows the normalized number of octaves where the target frequency response can be achieved for each level of dB reduction for the example shown in FIG. 5A. Note that the number of normalized octaves where the target frequency response is achieved is an irregular increasing function of dB reduction.

Figure 9A:
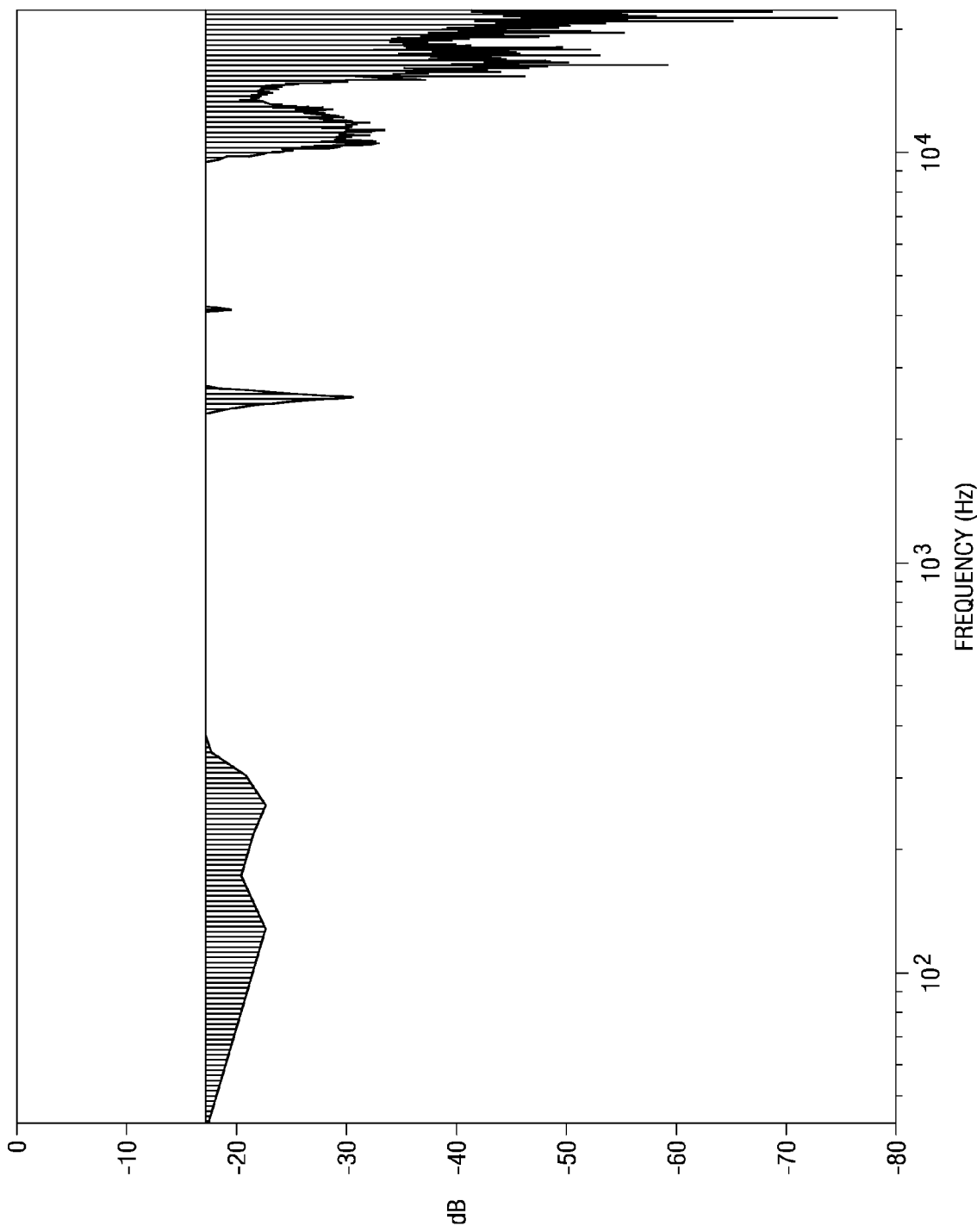
Figure 9B:
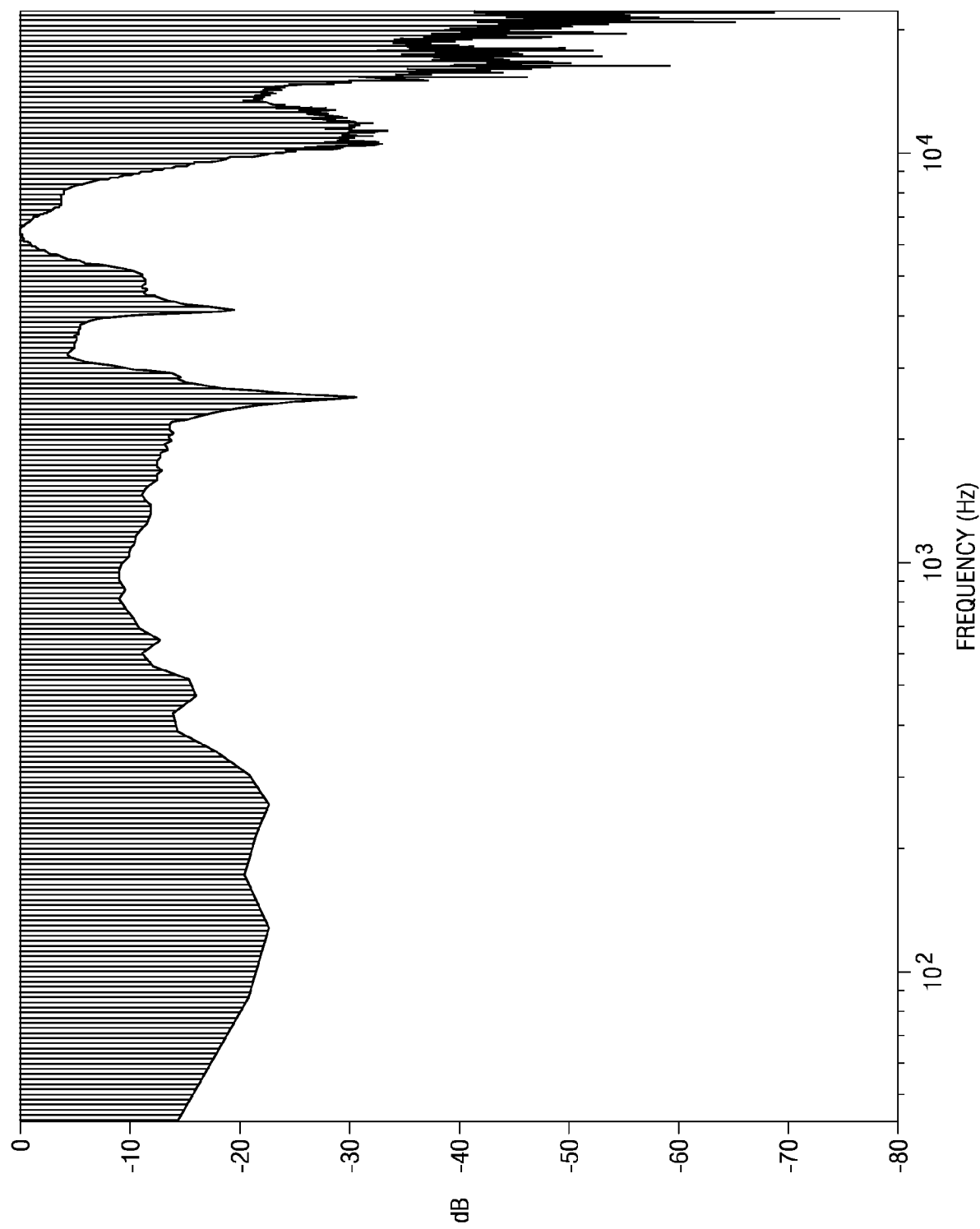

Referring again to FIG. 6, an equalization non-effectiveness score is also determined for the candidate dB drop. The equalization non-effectiveness score is based on the area below the target frequency response, i.e., the area between the target frequency response and the measured frequency response where the target frequency response is not reached, is calculated (608). More specifically, the area between the measured frequency spectrum and target frequency spectrum where the target cannot be achieved is estimated, i.e., the area where the target frequency spectrum is higher than the measured frequency spectrum as shown in the example in FIG. 9A for a flat target frequency spectrum. In one or more embodiments of the invention, this area is estimated by determining the differences between the target frequency spectrum and the measured frequency spectrum where the target frequency spectrum is higher than the measured frequency spectrum, multiplying each of the differences by a weighting to convert to a log frequency scale, and then summing the results. This area may also normalized by dividing by the unachieved area where the gain reduction parameter is 0 dB, i.e., the area where the target frequency spectrum is set to just touch the measured frequency spectrum and not go below it, as shown in the example of FIG. 9B. In some embodiments of the invention, the area measurement where the effect has not been achieved is weighted differently in different frequency ranges (e.g., using standard psychoacoustic weights or empirically determined weights).

Figure 10:
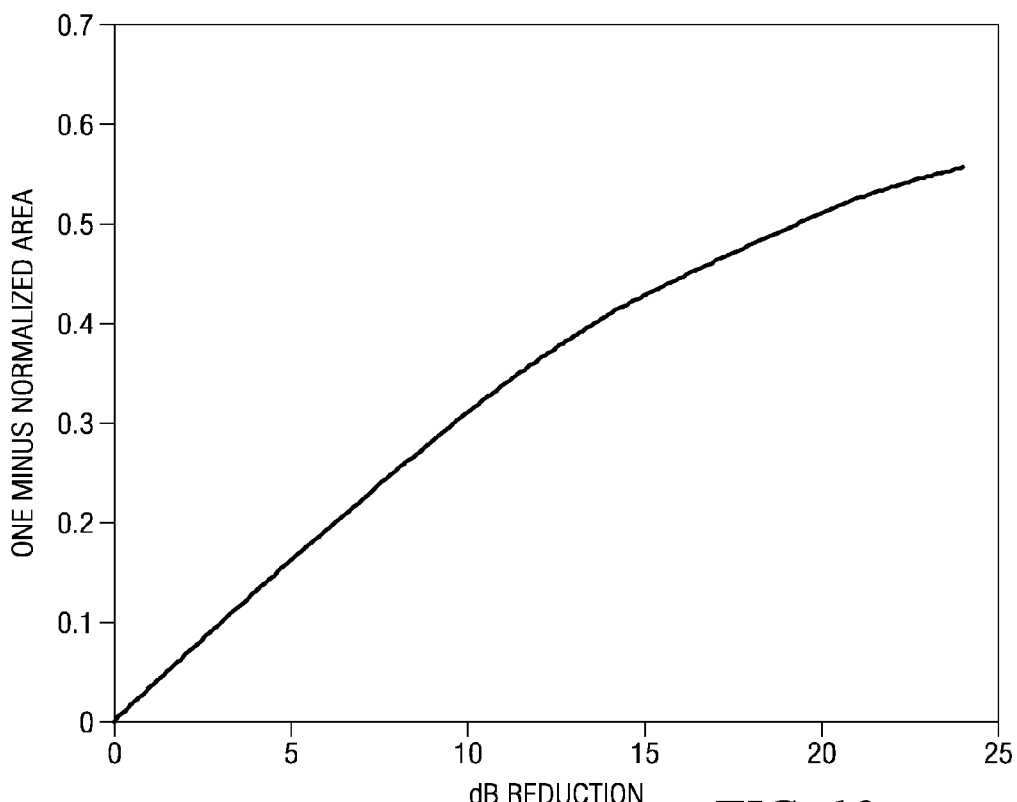

To generate the equalization non-effectiveness score, the estimated normalized area is converted by subtracting it from the number 1. FIG. 10 shows one minus the estimated normalized area between the target frequency spectrum and the measured frequency spectrum when the target frequency spectrum is above the measured frequency spectrum as a function of dB reduction. Usually this is a much smoother function than that shown in FIG. 8.

Figure 11A:
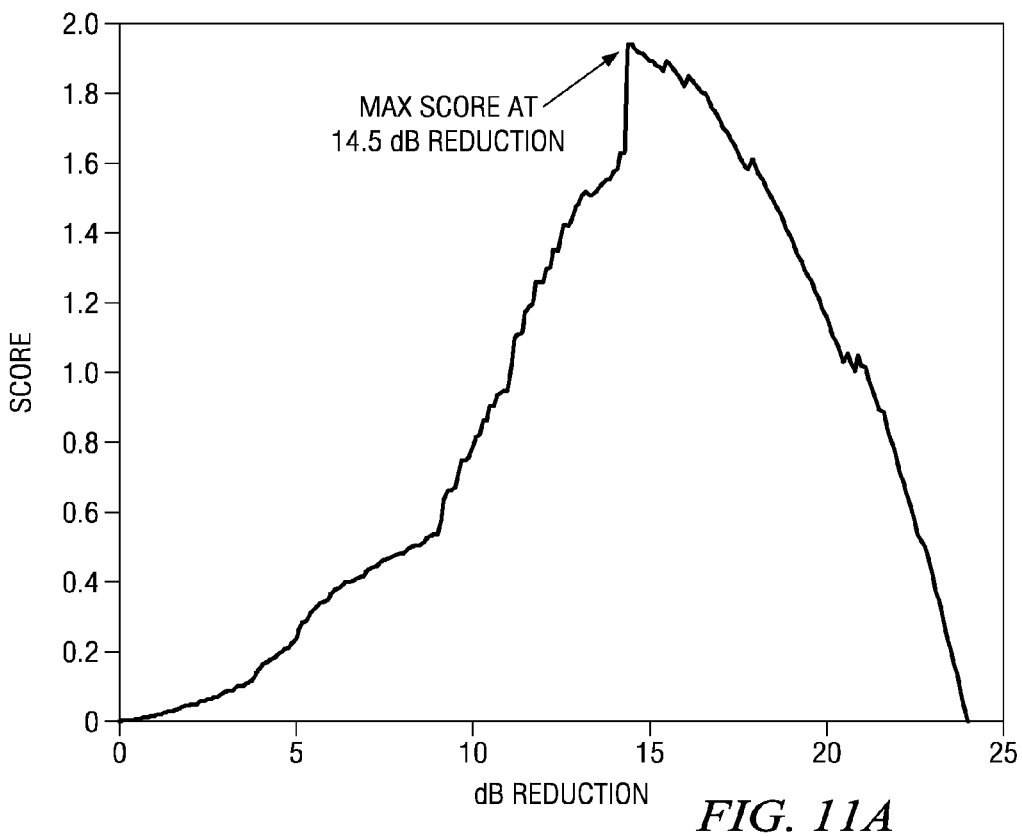

Once the three quality scores are determined (604, 606, 608), a composite quality score for the candidate dB drop is calculated (610). In one or more embodiments of the invention, the composite quality score is determined by multiplying the three quality scores. For the examples given above in FIGS. 7, 8 and 10, the composite quality score function is shown in FIG. 11A. The maximum composite quality score is found at 14.5 dB reduction. In some embodiments of the invention, the quality scores are weighted when determining the composite quality score to indicate the relative importance of noise, equalization effectiveness, and equalization non-effectiveness.

Figure 11B:
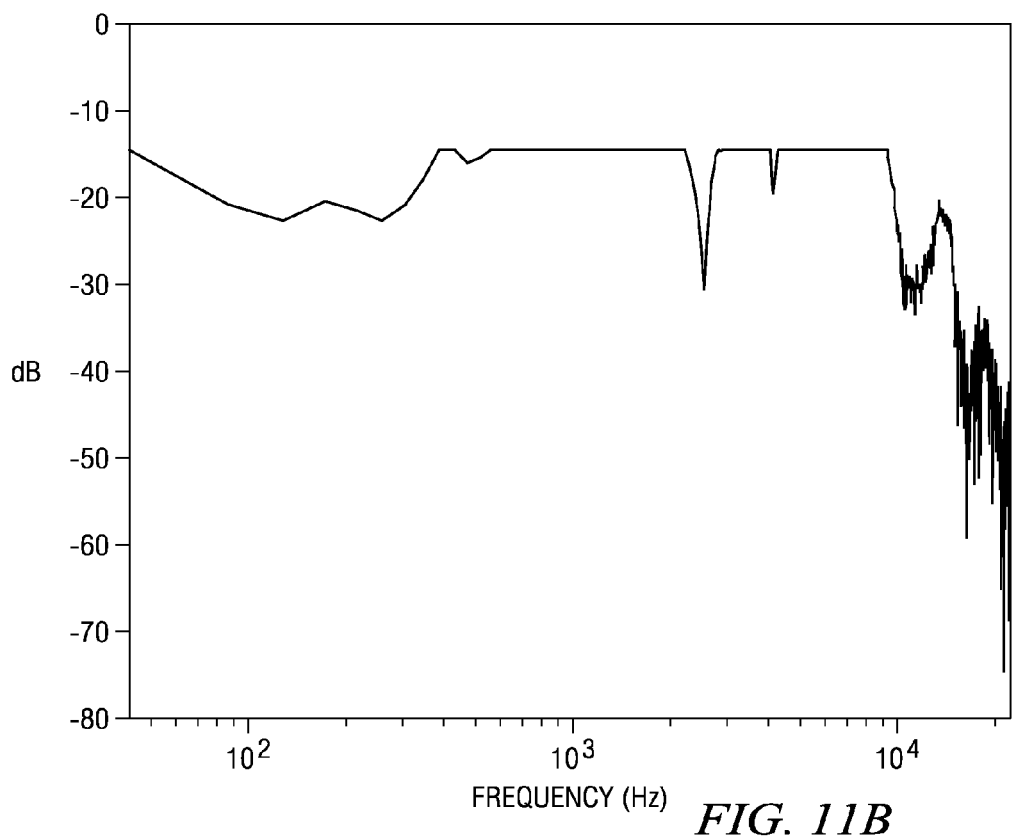

The composite quality score is then used to determine if the candidate dB drop is better than any candidate dB drop considered thus far (612). More specifically, if the composite quality score of the candidate dB drop is higher than the composite quality score of a previously determined best dB drop, the candidate dB drop is saved as the best dB drop (614). The dB drop value is then increased by the predetermined amount for the next iteration (616) and the next candidate dB drop is processed (600-614). Candidate dB drops are processed until the value of a candidate dB drop is less than zero (602). The best dB drop, i.e., the candidate dB drop with the maximum composite quality score, is then used as the actual dB reduction, i.e., gain reduction parameter level, in designing the compensating filter. The equalization resulting from the 14.5 dB reduction of FIG. 11A is shown in FIG. 11B.

In one or more embodiments of the invention, a sound score that provides information on how different the loudspeaker will sound is also determined for each candidate dB drop. The sound score is based on the area between the measured frequency spectrum and the target frequency spectrum where the target frequency spectrum can be achieved. If the sound score is calculated, it is included when determining the composite quality score for the candidate dB drop.

Figure 12:
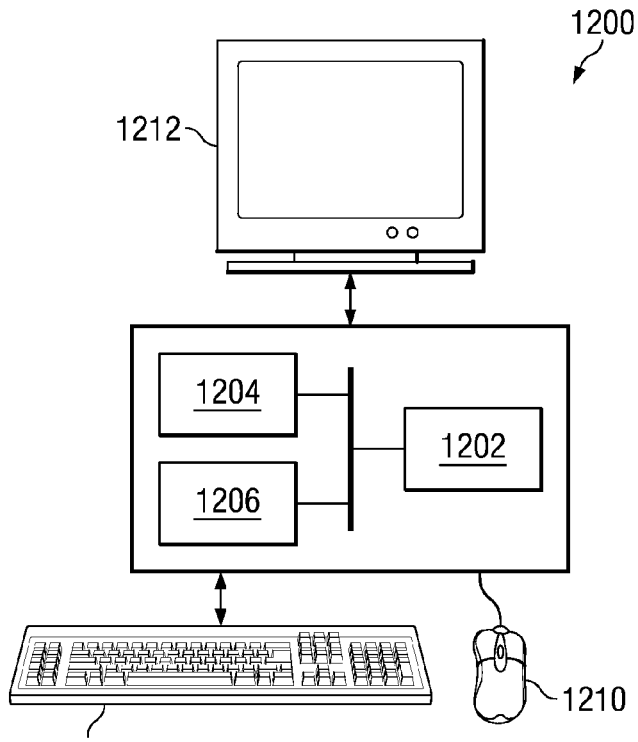
FIG. 12 shows an illustrative digital system in accordance with one or more embodiments of the invention.

Embodiments of the methods described herein may be implemented on virtually any type of digital system having processing capability, a loudspeaker, and a microphone. Examples include, but are not limited to a desk top computer, a laptop computer, a handheld device such as a mobile (i.e., cellular) phone, a personal digital assistant, a digital camera, an MP3 player, an iPod, etc. For example, as shown in FIG. 12, a digital system (1200) includes a processor (1202), associated memory (1204), a storage device (1206), and numerous other elements and functionalities typical of today's digital systems (not shown). In one or more embodiments of the invention, a digital system may include multiple processors and/or one or more of the processors may be digital signal processors. The digital system (1200) may also include input means, such as a keyboard (1208) and a mouse (1210) (or other cursor control device), and output means, such as a monitor (1212) (or other display device). The digital system ((1200)) may also include a microphone (not shown) for recording audio signals and one or more loudspeakers (not shown) for broadcasting audio signals. The digital system (1200) may be connected to a network (1214) (e.g., a local area network (LAN), a wide area network (WAN) such as the Internet, a cellular network, any other similar type of network and/or any combination thereof) via a network interface connection (not shown). Those skilled in the art will appreciate that these input and output means may take other forms.

Further, those skilled in the art will appreciate that one or more elements of the aforementioned digital system (1200) may be located at a remote location and connected to the other elements over a network. Further, embodiments of the invention may be implemented on a distributed system having a plurality of nodes, where each portion of the system and software instructions may be located on a different node within the distributed system. In one embodiment of the invention, the node may be a digital system. Alternatively, the node may be a processor with associated physical memory. The node may alternatively be a processor with shared memory and/or resources.

Software instructions to perform embodiments of the invention may be stored on a computer readable medium such as a compact disc (CD), a diskette, a tape, a file, or any other computer readable storage device. The software instructions may be a standalone program, or may be part of a larger program (e.g., a photo editing program, a web-page, an applet, a background service, a plug-in, a batch-processing command). The software instructions may be distributed to the digital system (1200) via removable memory (e.g., floppy disk, optical disk, flash memory, USB key), via a transmission path (e.g., applet code, a browser plug-in, a downloadable standalone program, a dynamically-linked processing library, a statically-linked library, a shared library, compilable source code), etc. The digital system (1200) may access an audio signal by reading it into memory from a storage device, receiving it via a transmission path (e.g., a LAN, the Internet), receiving it from the microphone, etc.

While the invention has been described with respect to a limited number of embodiments, those skilled in the art, having benefit of this disclosure, will appreciate that other embodiments can be devised which do not depart from the scope of the invention as disclosed herein. For example, the equalization subsystem (104) of FIG. 1 may be in a receiver component, an amplifier component, the loudspeaker (106) or in a specialized equalization component. Accordingly, the scope of the invention should be limited only by the attached claims. It is therefore contemplated that the appended claims will cover any such modifications of the embodiments as fall within the true scope and spirit of the invention.

What is claimed is:

1. A method for equalization of a loudspeaker, the method comprising:
    determining a noise score for a candidate gain reduction parameter level in a plurality of candidate gain reduction parameter levels, wherein the noise score is based on the relative reduction in a signal-to-noise ratio caused by the candidate gain reduction parameter level;
    determining an equalization effectiveness score for the candidate gain reduction parameter level, wherein the equalization effectiveness score is based on a number of octaves in a measured frequency response where an equalization effect is achieved using the candidate gain reduction parameter level;
    determining an equalization non-effectiveness score for the candidate gain reduction parameter level, wherein the equalization non-effectiveness score is based on an area between a target frequency response and the measured frequency response where the target frequency response is not reached using the candidate gain reduction parameter level;
    determining a composite quality score for the candidate gain level reduction using the noise score, the equalization effectiveness score, and the equalization non-effectiveness score; and
    designing a compensating filter for the loudspeaker using the candidate gain reduction parameter level if the composite quality score is better than composite quality scores of all other candidate gain reduction parameter levels in the plurality of candidate gain reduction parameter levels.

2. The method of claim 1, further comprising using the compensating filter to filter audio signals prior to reproduction of the audio signals by the loudspeaker.

3. The method of claim 1, wherein determining a composite quality score further comprises assigning relative weights to the noise score, the equalization effectiveness score, and the equalization non-effectiveness score.

4. The method of claim 1, wherein the plurality of candidate gain reduction parameter levels are in a range between and including a zero gain reduction parameter level and a maximum allowable gain reduction parameter level.

5. The method of claim 4, wherein the noise score is the maximum allowable gain reduction parameter level minus the candidate gain reduction parameter level, normalized by the maximum allowable gain reduction parameter level.

6. The method of claim 1, wherein
    determining an equalization effectiveness score further comprises normalizing the number of octaves where the equalization effect is achieved by a number of octaves considered when determining the number of octaves where the equalization effect is achieved; and
    determining an equalization non-effectiveness score further comprises normalizing the area by an area where the target frequency spectrum touches the measured frequency spectrum and does not go below the measured frequency spectrum.

7. The method of claim 1, wherein
    determining an equalization effectiveness score further comprises weighting frequency ranges in the measured frequency response before determining the number of octaves; and
    determining an equalization non-effectiveness score further comprises weighting frequency ranges in the measured frequency response before determining the area.

8. A digital system comprising:
    a processor;
    a loudspeaker; and
    a memory storing software instructions, wherein when executed by the processor, the software instructions cause the digital system to perform a method for equalization of the loudspeaker, the method comprising:
        determining a noise score for a candidate gain reduction parameter level in a plurality of candidate gain reduction parameter levels, wherein the noise score is based on the relative reduction in a signal-to-noise ratio caused by the candidate gain reduction parameter level;
        determining an equalization effectiveness score for the candidate gain reduction parameter level, wherein the equalization effectiveness score is based on a number of octaves in a measured frequency response where an equalization effect is achieved using the candidate gain reduction parameter level;
        determining an equalization non-effectiveness score for the candidate gain reduction parameter level, wherein the equalization non-effectiveness score is based on an area between a target frequency response and the measured frequency response where the target frequency response is not reached using the candidate gain reduction parameter level;
        determining a composite quality score for the candidate gain level reduction using the noise score, the equalization effectiveness score, and the equalization non-effectiveness score; and
        designing a compensating filter for the loudspeaker using the candidate gain reduction parameter level if the composite quality score is better than composite quality scores of all other candidate gain reduction parameter levels in the plurality of candidate gain reduction parameter levels.

9. The digital system of claim 8, wherein the method further comprises using the compensating filter to filter audio signals prior to reproduction of the audio signals by the loudspeaker.

10. The digital system of claim 8, wherein determining a composite quality score further comprises assigning relative weights to the noise score, the equalization effectiveness score, and the equalization non-effectiveness score.

11. The digital system of claim 8, wherein the plurality of candidate gain reduction parameter levels are in a range between and including a zero gain reduction parameter level and a maximum allowable gain reduction parameter level.

12. The digital system of claim 11, wherein the noise score is the maximum allowable gain reduction parameter level minus the candidate gain reduction parameter level, normalized by the maximum allowable gain reduction parameter level.

13. The digital system of claim 8, wherein
   determining an equalization effectiveness score further comprises normalizing the number of octaves where the equalization effect is achieved by a number of octaves considered when determining the number of octaves where the equalization effect is achieved; and
   determining an equalization non-effectiveness score further comprises normalizing the area by an area where the target frequency spectrum touches the measured frequency spectrum and does not go below the measured frequency spectrum.

14. The digital system of claim 8, wherein
   determining an equalization effectiveness score further comprises weighting frequency ranges in the measured frequency response before determining the number of octaves; and
   determining an equalization non-effectiveness score further comprises weighting frequency ranges in the measured frequency response before determining the area.

15. A computer readable medium comprising executable instructions to perform a method for equalization of a loudspeaker when executed by a processor, the method comprising:
   determining a noise score for a candidate gain reduction parameter level in a plurality of candidate gain reduction parameter levels, wherein the noise score is based on the relative reduction in a signal-to-noise ratio caused by the candidate gain reduction parameter level;
   determining an equalization effectiveness score for the candidate gain reduction parameter level, wherein the equalization effectiveness score is based on a number of octaves in a measured frequency response where an equalization effect is achieved using the candidate gain reduction parameter level;
   determining an equalization non-effectiveness score for the candidate gain reduction parameter level, wherein the equalization non-effectiveness score is based on an area between a target frequency response and the measured frequency response where the target frequency response is not reached using the candidate gain reduction parameter level;
   determining a composite quality score for the candidate gain level reduction using the noise score, the equalization effectiveness score, and the equalization non-effectiveness score; and
   designing a compensating filter for the loudspeaker using the candidate gain reduction parameter level if the composite quality score is better than composite quality scores of all other candidate gain reduction parameter levels in the plurality of candidate gain reduction parameter levels.

16. The computer readable medium of claim 15, wherein the method further comprises using the compensating filter to filter audio signals prior to reproduction of the audio signals by the loudspeaker.

17. The computer readable medium of claim 15, wherein the plurality of candidate gain reduction parameter levels are in a range between and including a zero gain reduction parameter level and a maximum allowable gain reduction parameter level.

18. The computer readable medium of claim 17, wherein the noise score is the maximum allowable gain reduction parameter level minus the candidate gain reduction parameter level, normalized by the maximum allowable gain reduction parameter level.

19. The computer readable medium of claim 15, wherein
   determining an equalization effectiveness score further comprises normalizing the number of octaves where the equalization effect is achieved by a number of octaves considered when determining the number of octaves where the equalization effect is achieved; and
   determining an equalization non-effectiveness score further comprises normalizing the area by an area where the target frequency spectrum touches the measured frequency spectrum and does not go below the measured frequency spectrum.

20. The computer readable medium of claim 15, wherein
   determining an equalization effectiveness score further comprises weighting frequency ranges in the measured frequency response before determining the number of octaves; and
   determining an equalization non-effectiveness score further comprises weighting frequency ranges in the measured frequency response before determining the area.

* * * * *